United States Patent
Bailey, III et al.

(10) Patent No.: US 7,575,638 B2
(45) Date of Patent: Aug. 18, 2009

(54) APPARATUS FOR DEFINING REGIONS OF PROCESS EXCLUSION AND PROCESS PERFORMANCE IN A PROCESS CHAMBER

(75) Inventors: Andrew D. Bailey, III, Pleasanton, CA (US); Jack Chen, Fremont, CA (US); Yunsang Kim, Monte Sereno, CA (US); Gregory S. Sexton, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 11/701,854

(22) Filed: Feb. 2, 2007

(65) Prior Publication Data

US 2008/0185105 A1 Aug. 7, 2008

(51) Int. Cl.
- B05B 5/025 (2006.01)
- C23C 16/00 (2006.01)
- C23F 1/00 (2006.01)
- H01L 21/306 (2006.01)

(52) U.S. Cl. .............. 118/624; 118/715; 118/723 E; 118/723 R; 156/345.3; 156/345.44; 156/345.45; 156/345.46; 156/345.47

(58) Field of Classification Search ............ 156/345.43; 118/624

See application file for complete search history.

(56) References Cited

U.S. PATENT DOCUMENTS

| | | | | |
|---|---|---|---|---|
| 5,135,608 A | * | 8/1992 | Okutani | 438/584 |
| 5,246,532 A | | 9/1993 | Ishida | 156/345 |
| 5,273,588 A | | 12/1993 | Foster et al. | 118/723 E |
| 5,824,158 A | * | 10/1998 | Takeuchi et al. | 118/723 IR |
| 6,051,122 A | * | 4/2000 | Flanigan | 204/298.11 |
| 6,364,957 B1 | | 4/2002 | Schneider et al. | 118/728 |
| 6,436,819 B1 | * | 8/2002 | Zhang et al. | 438/656 |
| 6,676,760 B2 | | 1/2004 | Kholodenko et al. | 118/728 |
| 6,837,967 B1 | | 1/2005 | Berman et al. | 156/345.3 |
| 2004/0108068 A1 | * | 6/2004 | Senzaki et al. | 156/345.43 |
| 2004/0238488 A1 | * | 12/2004 | Choi et al. | 216/58 |
| 2005/0173067 A1 | * | 8/2005 | Lim | 156/345.32 |
| 2005/0263484 A1 | * | 12/2005 | Park et al. | 216/59 |
| 2007/0068900 A1 | * | 3/2007 | Kim et al. | 216/67 |

FOREIGN PATENT DOCUMENTS

| | | |
|---|---|---|
| JP | 61-577 | 1/1986 |
| JP | 62-128538 | 6/1987 |
| JP | 62-287072 | 12/1987 |
| JP | 1-230766 | 9/1989 |

\* cited by examiner

*Primary Examiner*—Michael Cleveland
*Assistant Examiner*—Keath T Chen
(74) *Attorney, Agent, or Firm*—Martine Penilla & Gencarella, LLP

(57) ABSTRACT

Positional relationships are established in a process chamber. An upper electrode is configured with a first surface to support a wafer, and an electrode has a second surface. A linear drive is mounted on the base and a linkage connected between the drive and the upper electrode. Linkage adjustment defines a desired orientation between the surfaces. The linear drive and linkage maintain the desired orientation while the assembly moves the upper electrode with the surfaces moving relative to each other. An annular etching region defined between the electrodes enables etching of a wafer edge exclusion region extending along a top and bottom of the wafer. Removable etch defining rings are configured to define unique lengths along each of the top and bottom of the wafer to be etched. Positional relationships of the surfaces enable limiting the etching to those unique lengths of the exclusion region.

20 Claims, 11 Drawing Sheets

APPARATUS FOR DEFINING REGIONS OF PROCESS EXCLUSION AND PROCESS PERFORMANCE IN A PROCESS CHAMBER

RELATED APPLICATION

This application is related to U.S. patent application Ser. No. 11/704,870, entitled "Methods of and Apparatus For Aligning Electrodes In A Process Chamber To Protect An Exclusion Area Within An Edge Environ Of A Wafer", U.S. application Ser. No. 11/704,870 filed on Feb 8, 2007.

BACKGROUND

1. Field

The present invention relates generally to semiconductor manufacturing and, more particularly, to apparatus for defining regions of process exclusion and of process performance in a process chamber for manufacturing semiconductor wafers, wherein a process such as etching is excluded from a central area of the wafers, and an etching process is allowed to be performed on the wafer outside of the central area on an edge environ of the wafer.

2. Description of the Related Art

Vacuum processing chambers have been used for etching materials from substrates and for deposition of materials onto substrates. The substrates have been semiconductor wafers, for example. In general, accurate processing (and thus high yields of devices) is expected to occur in a central area of the wafer. Numerous difficulties are experienced in attempting to accurately process the wafer on a portion of a top, or upper, surface of the wafer, wherein that portion is between the central area and a peripheral edge of the wafer that surrounds the central area. Such difficulties are significant enough that an "edge exclusion area" has been defined between the central area and that edge of the wafer surrounding the central area of the upper surface. No attempt is made to provide acceptable devices in that edge exclusion area.

Additionally, during the desired processing of the central area, undesired deposits, materials, or process-by-products (collectively "undesired materials"), accumulate or result on the edge exclusion area of the upper surface of the wafer, and on an edge area around the peripheral edge of the wafer, and below the edge area on a bottom area of an opposite (bottom) surface of the wafer. Those three areas are not to be processed to form devices. The edge exclusion area, the edge area, and the bottom area are referred to collectively as the "edge environ". These undesired materials may generally accumulate on the edge environ. The accumulation is so extensive that the desired processing of the central area must be interrupted because, in general, it is desired to keep the edge environ substantially clean so as to avoid flaking of material particulates that may redeposit back onto the active device regions on the upper surface of the wafer. Such flaking can occur during any number of wafer handling or transport operations. Thus, it is a general desire that the edge environ be periodically cleaned (e.g., etched) or monitored for cleaning (i.e., etching) during the numerous processing operations used to fabricate integrated circuit device chips, from the processed wafers. The desired processing of the central area has been interrupted to perform such periodic cleaning in an attempt to remove the undesired materials from the edge environ, e.g. from the entire edge environ, and e.g., to perform such removal without damaging the devices.

However, as attempts are made to more accurately process the wafers, the specifications for such periodic cleaning are subject to change, e.g., from one batch of wafers to another batch of wafers. For example, from batch to batch the specifications may define different portions of the edge environ to be subjected to the cleaning process. Prior apparatus for such cleaning has not been readily adaptable to such changed specifications, such that problems have been experienced in attempts to efficiently perform more accurate removal of the undesired materials from every batch of wafers.

In view of the foregoing, what is needed is apparatus for edge environ cleaning that is readily adaptable to such changed specifications. What is also needed is apparatus that is configured to efficiently perform more accurate removal of the undesired materials on every batch of wafers even though the specifications for cleaning each batch may be changed from batch to batch. A further need is to rapidly configure apparatus for the removal of the undesired materials from the edge environ, the configuring conforming to a wide variety of specifications for such removal, by which the apparatus is rendered capable of removing the undesired materials from only a currently-specified portion of the edge environ and is capable of not damaging the central area. Also, despite such configuring, use of the configured apparatus should result in accurate (e.g., uniform) removal of the undesired materials from the entire currently-specified portion of the edge environ without removing materials from or otherwise damaging the central area.

SUMMARY

Broadly speaking, embodiments of the present invention fill these needs by providing semiconductor manufacturing apparatus configured for defining separate regions of process exclusion and process performance in a process chamber for manufacturing the semiconductor wafers. The apparatus may be configured so that a process such as etching is excluded from the central area of the wafers, and a process such as etching is allowed to be performed on the wafer only on the edge environ. In addition, these needs may be filled by apparatus for edge environ cleaning that is readily adaptable to such changed specifications. Such apparatus may fill these needs by being configured to efficiently perform more accurate removal of the undesired materials on every batch of wafers even though the specifications for cleaning each batch may be changed from batch to batch. To fill these needs, the apparatus may be configured to conform to a wide variety of specifications for such removal, and is capable of removing the undesired materials from only a currently-specified portion of the edge environ and is capable of not damaging the central area. Also, despite such configuring, use of the configured apparatus may result in accurate (e.g., uniform) removal of the undesired materials from the entire currently-specified portion of the edge environ without removing materials from or otherwise damaging the central area. For example, the configured apparatus may allow removal of the undesired material from different radial lengths of the edge environ according to specifications for different types of wafers.

Embodiments of the present invention may establish a plurality of positional relationships in a process chamber. A base may be configured with a first reference surface to support a wafer to be processed, as by etching. An electrode may be configured with a second reference surface. The positional relationships may be established with respect to the first reference surface and the second reference surface. A drive may be configured with a linear motion assembly mounted on the base and with a linkage connected between the linear motion assembly and the electrode. The linkage may be adjustable to define a desired orientation between the first and second reference surfaces. The linear motion assembly and linkage may be configured to maintain the desired orientation while the linear motion assembly moves the upper electrode so that the first and second reference surfaces move relative to each other from a first of the positional relationships to a second of the positional relationships.

Other embodiments of the present invention may provide an etching chamber. A lower electrode may support the wafer. A top electrode may have a center area that is not powered. The center area may be configured to be positioned in close proximity to a central area of the wafer when the wafer is supported by the lower electrode. An annular region of a process chamber may be defined between the top electrode and the lower electrode, the annular region defining an active etching zone. The active etching zone may be configurable to enable etching of a unique edge environ of the wafer. A top etch defining ring may be configured to define at least a portion of the active etching zone corresponding to a portion of the unique edge environ extending along a top length that extends radially along the upper surface of the wafer, the top length being in the active etching zone. A bottom etch defining ring may be configured to define at least a portion of the active etching zone corresponding to a portion of the unique edge environ extending along a bottom length along a bottom surface of the wafer, the bottom length being in the active etching zone.

Other embodiments of the present invention may provide apparatus for defining a zone of inactive etching and a zone of active etching in a process chamber configured for etching a wafer. A lower electrode may be configured to support the wafer in the process chamber with an upper edge environ of an upper surface of the wafer exposed for processing. The lower electrode may be further configured to support the wafer with a central area of the upper surface of the wafer within the upper edge environ exposed for processing. A top electrode may be configured with a center area corresponding to the central area of the wafer. The top electrode may be further configured with a top etch defining ring. The top etch defining ring may be configured to define an upper cavity overlying the upper edge environ of the wafer. The top electrode configuration may be such that the top electrode may be at a second positional relationship relative to the lower electrode so that the center area is separated from the central area by a uniformly thin space configured to exclude etching from the inactive etching zone defined by the uniformly thin space. The top electrode configuration may be further such that with the top electrode in the second positional relationship the upper cavity is oriented relative to the upper edge environ of the wafer to define an upper portion of the active etching zone in the chamber to permit etching of the upper edge environ.

BRIEF DESCRIPTION OF THE DRAWINGS

The embodiments of the present invention will be readily understood by reference to the following detailed description in conjunction with the accompanying drawings in which like reference numerals designate like structural elements, and wherein.

Other aspects and advantages of embodiments of the invention will become apparent from the following detailed description, taken in conjunction with the accompanying drawings, illustrating by way of example the principles of embodiments of the present invention.

DETAILED DESCRIPTION

In the following description, numerous specific details are set forth in order to provide a thorough understanding of embodiments of the present invention. It will be apparent, however, to one skilled in the art that the present invention may be practiced without some or all of these specific details. In other instances, well known process operations have not been described in detail in order not to obscure the present invention.

Embodiments of the present invention are described to fill the above-described needs by providing semiconductor manufacturing apparatus configured for defining separate regions of process exclusion and process performance in a process chamber for manufacturing the semiconductor wafers. For the process exclusion, the apparatus may be configured so that a process such as etching is excluded from the central area of the wafers. For process performance, a process such as etching may be allowed to be performed on the wafer only on the edge environ.

Embodiments of the present invention are also described to fill these needs by providing apparatus for edge environ cleaning, the apparatus being readily adaptable to changed specifications. Thus, such apparatus may fill these needs by being configurable to efficiently perform more accurate removal of the undesired materials on every batch of wafers even though the specifications for cleaning each batch may be changed, e.g., from batch to batch. To fill these needs, the configured apparatus may conform to a wide variety of those specifications for such removal, and is capable of removing the undesired materials from only a currently-specified portion of the edge environ and is capable of not damaging the central area. Also, despite such configuration, use of the configured apparatus may result in accurate (e.g., uniform) removal of the undesired materials from the entire currently-specified portion of the edge environ without removing materials from or otherwise damaging the central area. For example, the converted apparatus may allow removal of the undesired material from different radial lengths of the edge environ according to specifications for different types of wafers.

Figure 1:
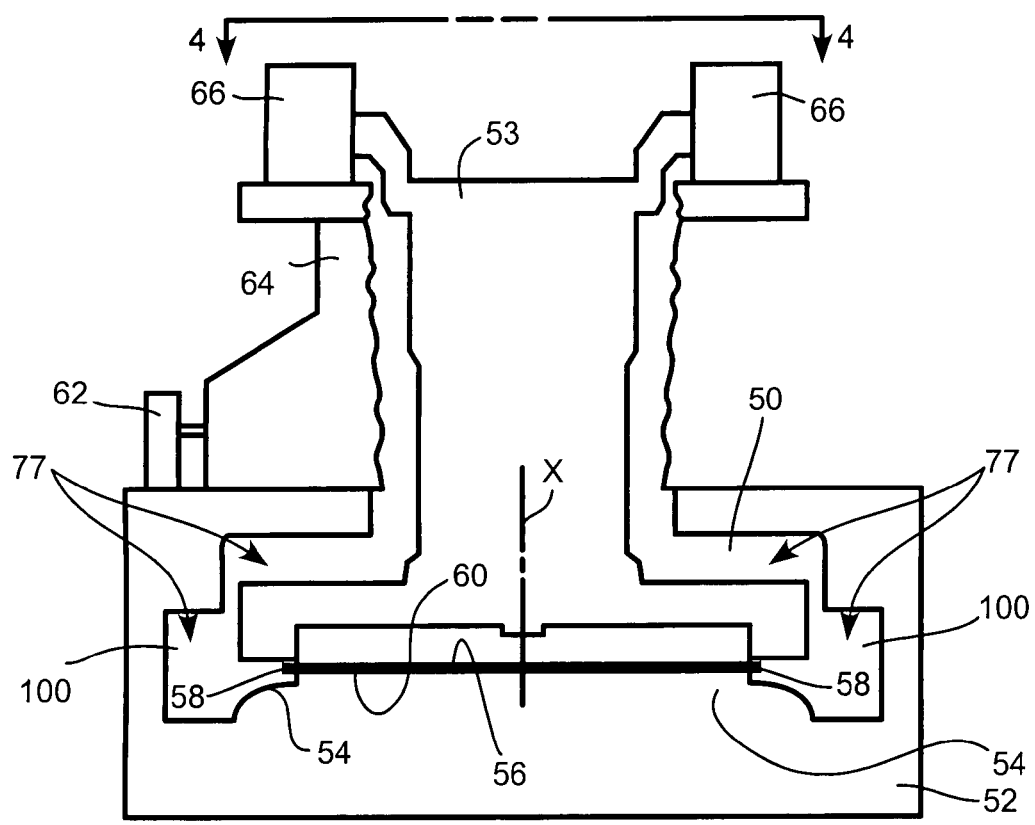
FIG. 1 is a schematic elevational view of a process chamber of an embodiment of the present invention in which a plurality of positional relationships may be established between a base, such as a bottom electrode, or chuck, and an upper, or top, electrode.

FIG. 1 shows a process chamber 50 in which a plurality of positional relationships may be established. Generally, the positional relationships may be established between a base 52 and a top electrode 53 in the chamber 50. In more detail, the base 52 may be configured with a lower electrode (or chuck) 54 having a first reference surface 56 to support a wafer 58 to be processed, as by etching or another desired process suitable for removing the undesired materials from the wafer. The top electrode 53 may be configured with a second reference surface 60. The top electrode is configured to provide power for processing the supported wafer.

Figure 2A:
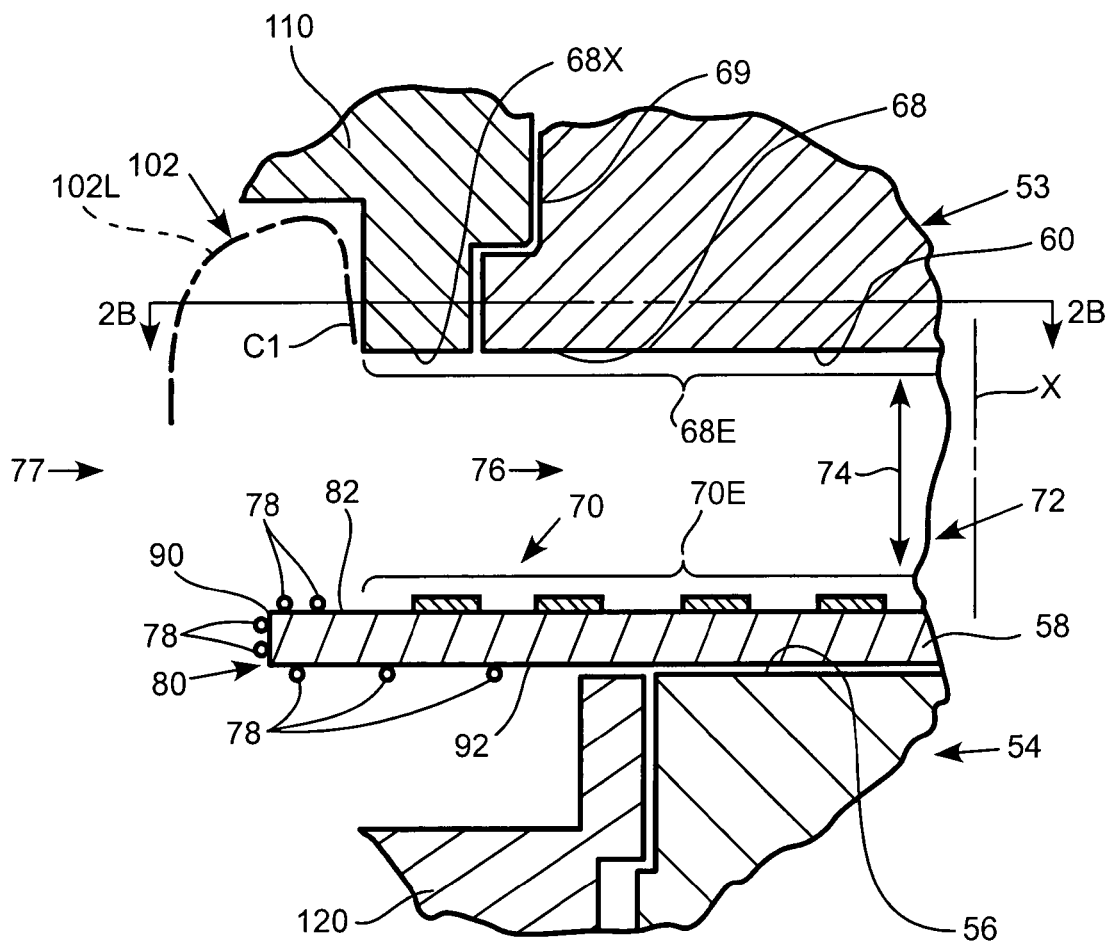
FIG. 2A is a view of an enlarged portion of FIG. 1 in which one of the positional relationships is illustrated between a first reference surface of the bottom electrode and a second reference surface of the top electrode.

FIG. 2A shows an enlarged portion of FIG. 1. FIG. 2A illustrates a first of the positional relationships between, or with respect to, the first reference surface 56 and the second reference surface 60. For establishing the relationships, FIG. 1 shows a drive 62 configured with an embodiment of a linear drive, such as a wedge, assembly 64 mounted on the base 52. FIG. 1 also shows a linkage 66 connected between the wedge assembly and the electrode 53. The linkage 66 may be adjustable to define a desired orientation between the first and second reference surfaces 56 and 60, e.g., parallelism and centering of the first and second reference surfaces 56 and 60. The linkage 66 may be configured to maintain the desired orientation (e.g., parallel and centered) while the linear drive assembly 64 moves the top electrode 53. The enlarged view of FIG. 2A shows that moving the top electrode 53 may cause the first and second reference surfaces 56 and 60 to move relative to each other, which may be from the first positional relationship (FIG. 2A) to a second positional relationship shown in FIG. 2C, and back again.

Figure 2B:
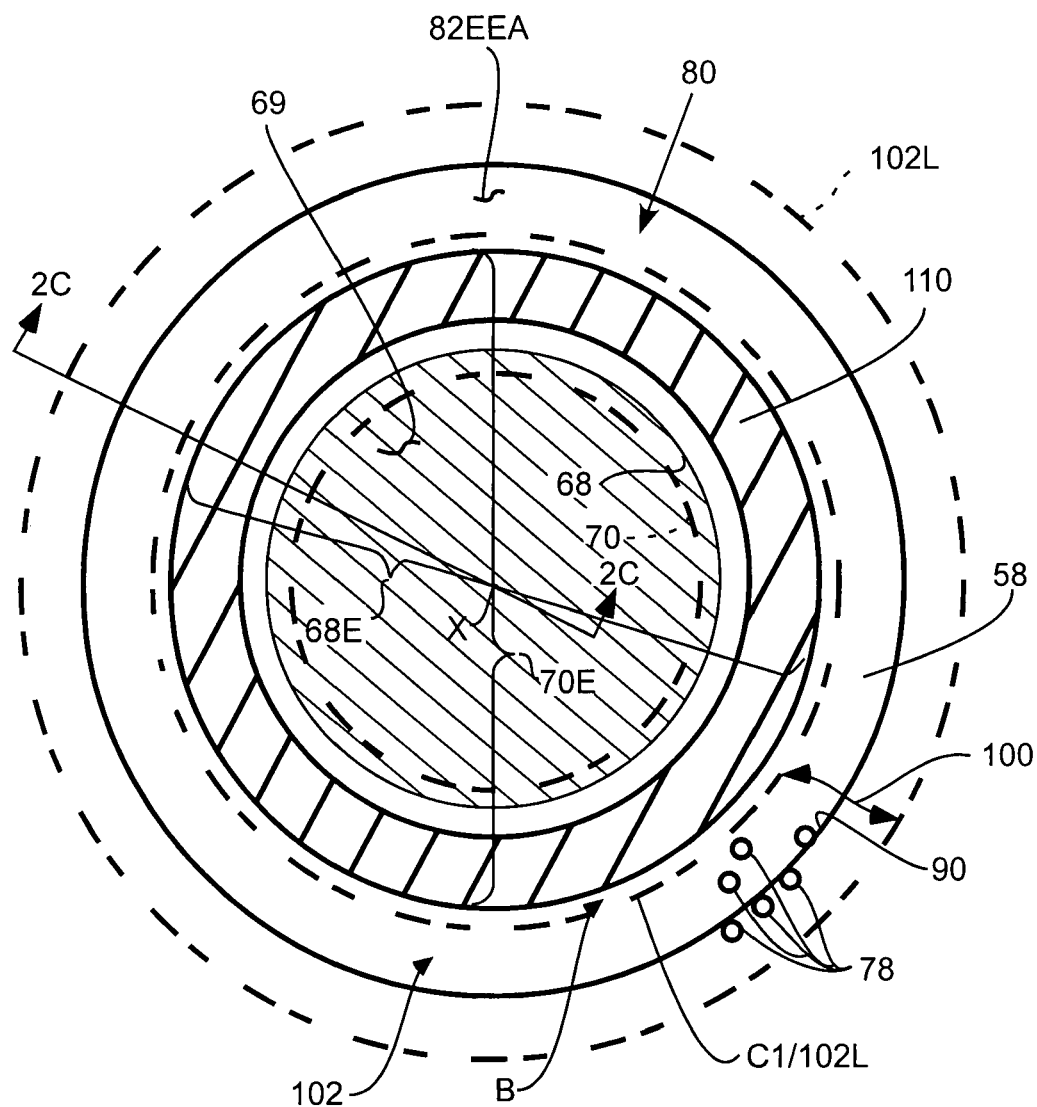
FIG. 2B is a cross sectional view taken along line 2B-2B in FIG. 2A, illustrating a toroidal configuration of an etching region defined between the bottom electrode and the top electrode.

FIG. 2A shows the top electrode 53 having a center area 68. The center area 68 extends radially as shown by a portion of bracket 68E. The cross sectional view of FIG. 2B shows the center area 68 as being circular and the wafer 58 having a center at axis X. The center area is not powered and may be configured from an insert 69 mounted on the top electrode 53. The insert 69 may be fabricated from a dielectric such as ceramic, for example. A portion of the center area 68 identified by 68X extends radially further outwardly than the insert 69, and is described below.

FIG. 2A shows the insert 69 configured with the second reference surface 60. Thus, with the insert 69 mounted on the top electrode 53 the insert provides the second reference surface 60 of the top electrode. In the first positional relationship shown in FIG. 2A, the second reference surface 60 is separated by a space 72 from the first reference surface 56 of a central area 70 of the wafer 58 when the wafer is supported by the lower electrode 54 mounted on the base 52. The space 72 is configured radially across the insert 69 and wafer 58, and extends in a vertical direction (arrow 74) that is sufficient (large) in two respects. One, the space 72 is configured to permit access to the wafer 58 on the lower electrode 54 for wafer loading on the lower electrode and removal of the wafer from the lower electrode. Two, the space 72 is also configured to provide a normal-size process, or etching, zone 76 between the top electrode 53 and the wafer 58 on the lower electrode 54. With this space 72, if the top electrode 53 were powered, a plasma could light up in the normal-size zone 76. It may be appreciated that with the normal-size process zone 76 between the top electrode and the wafer (resulting from the first positional relationship), such plasma would have access to the central area 70. It may be understood then that the space 72 (and the normal-size zone 76) may be part of a process chamber cavity 77. In FIG. 2A, bracket 70E defines a left and a central extent of the central area 70 that extends to the center axis X of the wafer 58, and FIG. 2B shows the full extent of the central area 70. FIG. 2A shows that when the desired process is for removing undesired materials 78 only from edge environ 80 of the wafer, and not for removing undesired materials 78 or any other materials from the central area 70 where devices may be on the wafer, the plasma in normal-size process zone 76 would be unacceptable because the devices must not be damaged (e.g., by plasma).

Figure 2C:
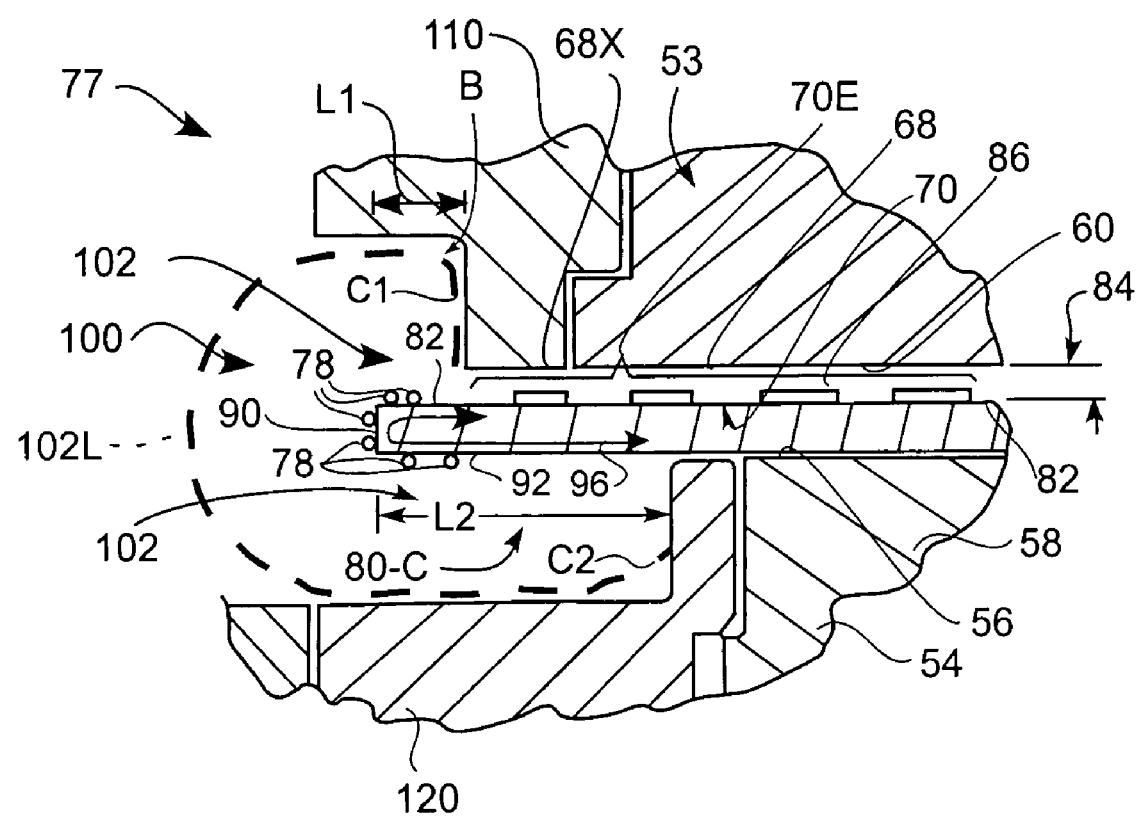
FIG. 2C is a cross sectional view taken along line 2C-2C in FIG. 2B, illustrating an enlarged view of the top electrode configured with the second reference surface of a center area in the second positional relationship with the first reference surface, showing one embodiment of the toroidal etching region for etching all of the edge environ including one configuration of two electrode rings that provide one generally C-shaped cross sectional configuration of the region.

Embodiments of the present invention avoid such damage to the devices, and limit the plasma to action on edge environ 80 that is to be subjected to the processing. FIG. 2C shows the second positional relationship, and illustrates the second reference surface 60 in close proximity to the central area 70 of the wafer 58 when the wafer is supported by the lower electrode 54. Bracket 70E indicates a portion of the radial extent of the central area 70 that extends from the axis X of the wafer 58. The second reference surface 60 is thus in close proximity to the first reference surface 56. The second reference surface 60 is also almost touching an upper surface 82 of the wafer, e.g., may be separated from the wafer surface 82 by a space 84 defined below. Thus, in the second positional relationship, the described space 72 (FIG. 2A) no longer exists. As a result, when portions of the top electrode 53 are powered, no plasma access to the central area 70 of the wafer 58 is permitted, and there is no normal-size process (etching) zone 76 between the center area 68 of the top electrode 53 and the central area 70 of the wafer 58 on the lower electrode 54. Thus, a plasma may not light up between the center area 68 and the central area 70. Instead of the space 72 and the normal-size zone 76 of the chamber cavity 77, FIG. 2C shows that with the surfaces 56 and 60 in close proximity the space 84 is axially-thin and defines the chamber cavity 77 as being configured with an inactive etching zone 86 between the central area 70 of the wafer and the center area 68 of the top electrode 53. The zone 86 defined by the thin space 84 is referred to as an "inactive" etching zone because the central area 70 and the center area 68 are so close that a plasma cannot light up in the thin space 84. Thus, no etching occurs in the space 84 and such devices as may be on the central area 70 of the wafer 58 are not damaged. This spacing of the central area 70 and the center area 68 results from the close proximity of the second reference surface 60 with the first reference surface 56 and may configure the inactive etching zone 86 with a dimension in a direction of movement of the electrode 53 (i.e., the direction of the X axis) of about 0.010 inches to about 0.020 inches, for example, and with a dimensional tolerance of about plus or minus 0.002 inches.

Having described embodiments of the present invention that avoid such damage to the devices, the following describes embodiments that limit the plasma to action on the edge environ 80 that is to be subjected to the processing, e.g., etching. In a general sense, each different embodiment may result in a different configuration of the edge environ, such that each particular edge environ may be described as being "unique" and may conform to a different one of the above-described specifications. FIGS. 2B and 2C show one embodiment of the edge environ 80 including a peripheral edge 90 of the wafer. The edge 90 is radially spaced from the axis X of the wafer, e.g., for a 300 mm wafer 58, the radial space from the axis X is thus 150 mm. The upper surface 82 of the wafer extends radially inward from the edge 90 and includes the central area 70. A bottom surface 92 of the wafer is below the edge 90, opposite to the upper surface 82, and also extends radially inward from the edge 90. FIG. 2B shows the edge environ 80 extending radially inwardly from the edge 90 along an outer annular portion of the upper surface 82. The outer annular portion is radial relative to the axis X. The amounts of these radial inward portions are described below in connection with different embodiments of the edge environ, and may include different embodiments of the above-described edge exclusion area defined between the central area 70 and the edge 90. To indicate that the edge exclusion area is part of the upper surface 82, the edge exclusion area is identified by 82EEA in FIG. 2B, and is thus also a part of the edge environ 80. As described above, the edge exclusion area 82EEA surrounds the central area 70, and in the processing of the central area 70, no attempt is made to provide acceptable devices on that area 82EEA.

For clarity of description, in FIG. 2C a line 96 indicates an extent of one embodiment of the edge environ 80. In each embodiment, the edge environ is configured as an annular surface portion of the outer extremity of the wafer. The wafer axis X is at the center of the annular portion. FIG. 2C shows one embodiment of the annular edge environ 80 (i.e., the edge 90, and portions of the surfaces 82 and 92) having an accumulation of the undesired materials 78. FIG. 2B shows some of the materials on the area 82EEA and on the edge 90. In all embodiments of the edge environ 80, it is the annular edge environ (the annular portion comprising edge 90, and different the wafer portions, of surfaces 82 and 92) that is not to be processed to form devices, and that is to be etched to remove the materials 78. In other words, it is only the edge environ 80 that is to be etched, and not the central area 70, because devices on that area 70 would be damaged by the etching. Also, it is the edge environ 80 from which it is desired to have uniform removal of the undesired materials 78, so that complete removal of the materials 78 occurs all around the outer annular portion of the wafer, i.e., complete removal from the edge environ 80. This removal is uniform removal all around the wafer axis X. As defined by the above-described specifications, each different specification may result in a different configuration of the edge environ, such that each particular specified edge environ may be "unique". The particular specified edge environ is thus referred to as a "currently-specified" edge environ 80.

FIG. 1 shows the process chamber 50 defining the chamber cavity 77 that encloses a lower section of the top electrode 53, and the lower electrode 54. FIG. 2C also shows that with the second positional relationship established, the chamber cavity 77 of the process chamber 50 may be configured with a toroidal, or annular, etching region 100 defined between the top electrode 53 and the lower electrode 54. The etching region 100 defines an active etching, or active etch, zone 102 shown inside a dash-dot-dash line 102L in FIG. 2C. As is more fully described below, in a general sense embodiments of the present invention render the etching region, with the active etching zone 102, configurable.

An exemplary cross-section of the region 100 is shown defined by the line 102L in FIG. 2C. The annular etching region 100 shown in FIG. 2C is illustrated as being configured with one embodiment of the active etching zone 102 having an exemplary generally C-shaped cross section. This C-shape extends around, or encompasses, one embodiment of the annular edge environ 80 (e.g., as identified by line 96), and extends from one end C1 to an opposite end C2. For reference, in FIG. 2A the end C1 of the line 102L identifying the active etching zone 102 is shown. In the cross section of FIG. 2B the end C1 and line 102L are shown as being circular and extending around the axis X. The line 102L is also shown in FIG. 2B radially outward of the edge 90 to indicate the radial amount (or extent) of the annular (or toroidal) etching region 100. The active etching zone 102 is also shown adjacent to the edge environ 80. In FIG. 2A the section line 2B-2B also crosses the line 102L between the ends C1 and C2.

The exemplary generally C-shaped cross section of the FIG. 2C embodiment of the region 100 is a region of plasma light up. In FIG. 2C the region 100 with this exemplary cross section is shown adjacent to a top length L1 of the upper surface 82. For this exemplary C-shaped cross section, L1 identifies a radially-extending portion of the upper surface 82 from which it is desired to remove the undesired materials 78. The region 100 is also shown adjacent to the edge 90 of the wafer 58. For this exemplary C-shaped cross section, the edge 90 is also a portion of the edge environ from which it is desired to remove the undesired materials 78. This exemplary region 100 extends from C1 along the length L1 of the upper surface 82, around the peripheral edge 90 and to the bottom surface 92 of the wafer. The region 100 extends along a bottom length L2 of the bottom surface 92 to C2. For this exemplary C-shaped cross section, L2 identifies a radially-extending portion of the lower surface 92 of the edge environ 80 from which it is desired to remove the undesired materials 78. In this embodiment, the edge environ 80 of the wafer 58 thus includes the lengths L1 and L2 and the edge 90, and for ease of description is identified in FIG. 2C as "80-C" that is one of the unique edge environs 80. Thus, it may be understood that the active etch zone 102 defined by the region 100 is shown in FIG. 2C extending within the line 102L from the end C1 radially outwardly, adjacent to and around the annular edge environ 80-C to end C2, to enable the removal of the undesired materials 78 from this exemplary unique edge environ 80-C. This embodiment of the active etch zone 102 thus corresponds to the unique edge environ 80-C.

In review of the FIG. 2C embodiment, the combined configurations of the lower electrode 54 and the top electrode 53 define the annular etching region 100 as an annular process chamber region between the base 52 and the top electrode 53. The region 100 defines the active etch, or active etching, zone 102 that is part of the chamber cavity 77. In this manner, and consistent with the various embodiments of the present invention, the FIG. 2C embodiment is configured so that the annular etching region 100 and the active etch zone 102 extend around and are separate from the inactive etch zone 86.

FIG. 2C shows a border B between the end C1 of the exemplary annular etching region 100 and the exemplary inactive etch zone 86 described above. Also, even though the inactive etch zone 86 is not shown in FIG. 2B, FIG. 2B indicates the radial location of the border B, and shows the border as being circular and adjacent to the end C1 of the line 102L that identifies the active etch zone 102. The border B may be located radially relative to the axis X according to a wafer specification, and is generally outward from the outside of the insert 69 of the top electrode 53.

Figure 2D:
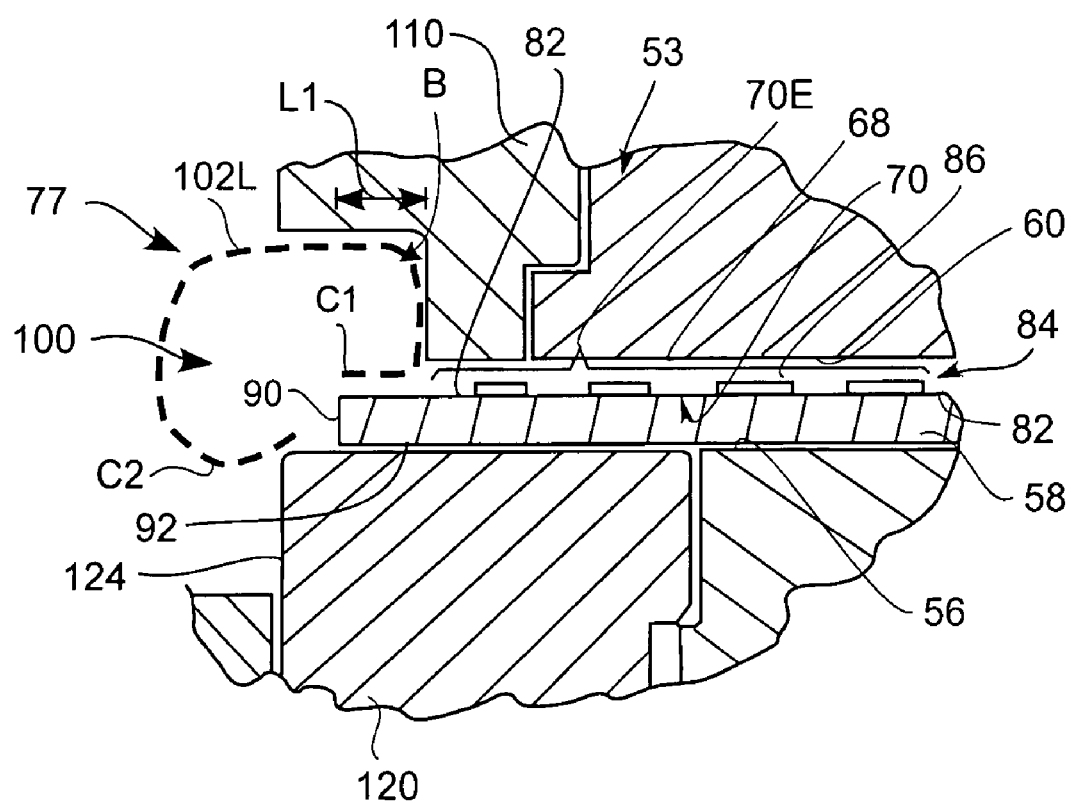
FIG. 2D is a cross sectional view similar to FIG. 2C, illustrating another enlarged view of the top electrode in the second positional relationship with the first reference surface, showing another embodiment of the toroidal etching region configured with two electrode rings that provide another cross sectional configuration of the region for etching only the top and edge of the edge environ.
Figure 2E:
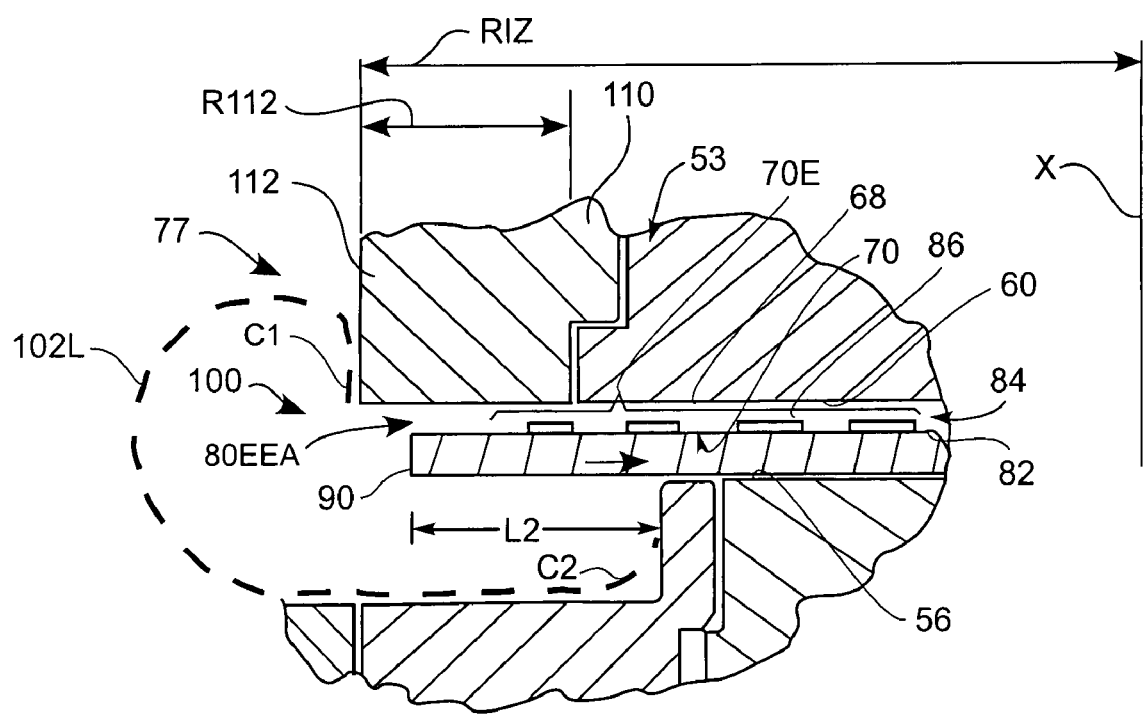
FIG. 2E is a cross sectional view similar to FIGS. 2C and 2D, illustrating another enlarged view of the top electrode in the second positional relationship with the first reference surface, showing one other embodiment of the toroidal etching region configured with two electrode rings that provide yet another cross sectional configuration of the region for etching only the bottom and edge of the edge environ.

Referring to FIGS. 2C to 2E, it may be understood that different process specifications may define different characteristics for manufacturing different types of wafers 58. For example, the different specifications may call for a different first type of wafer to have one set of lengths L1 & L2. For example, for the exemplary C-shaped cross section shown in FIG. 2C, values of the lengths L1 and L2 may be specified. Length L1 (a top length) may primarily define the portion of the upper wafer surface 82 from which the undesired materials 78 are to be uniformly removed, and may secondarily define the portion of the upper wafer surface 82 that is not to receive devices during processing of the central area 70. Such portion may correspond to the above-described edge exclusion area 82EEA that is also a part of the edge environ 80-C. Length L2 (a bottom length) may primarily define the portion of the lower wafer surface 92 from which the undesired materials 78 are to be uniformly removed. To provide a general reference to the portions of the wafer 58 from which the undesired materials 78 are to be uniformly removed, each length L1 and L2 may also be described as defining part of an edge exclusion area 82EEA, e.g., length L1 defining a top edge exclusion area, and length L2 defining a bottom edge exclusion area. Thus, lengths L1 and L2 may thus combine to define amounts of surfaces 82, 90, and 92 that must be uniformly cleared of any undesired materials 78.

A second type of wafer may be specified to have a different set of respective top and bottom lengths L1 and L2. For example, each of L1 and L2 of one set may have a value other than zero, but different from the value of another set. Also, as shown in FIG. 2D, L2 may be defined by one set of specifications as having a value of zero (and is thus not shown) and L1 a non-zero value. The L1 value may be different from the respective values of L1 of another set. In the L2=zero example, the lower surface 92 would not have to be cleared of any undesired materials 78. In a reverse of the FIG. 2D example, FIG. 2E shows that L1 may be defined by one set of specifications as having a value of zero (and is thus not shown) and L2 a non-zero value. Here, the L2 value may be different from the respective values of L2 of another set. In the L1=zero example, the upper surface 82 would not have to be cleared of any undesired materials 78. Generally, because it is likely that the top surface 82 will have undesired materials 78 on it on completion of a process, a value of L1 is less likely to be zero than a value of L2.

Figure 2F:
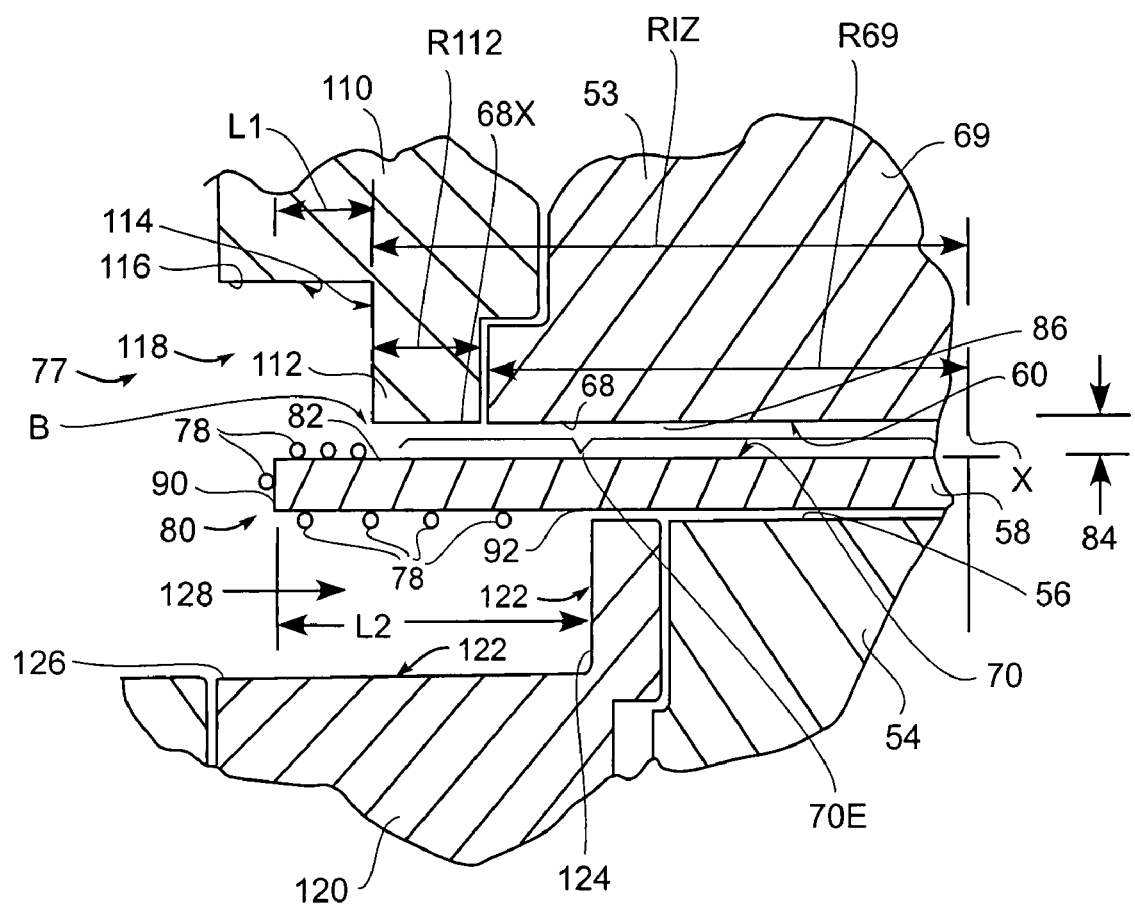
FIG. 2F is a cross sectional view similar to FIG. 2C, illustrating configurational aspects of the rings shown in FIG. 2C.

For readily adapting to such changed specifications, the upper electrode 53 and lower electrode 54 may be configured to efficiently perform the more accurate removal of the undesired materials 78 from every batch of the wafers 58 even though such specifications for cleaning each batch may be changed from batch to batch. This may be referred to as accommodating such exemplary different specifications. For this accommodating, embodiments of the present invention may include a plurality, or set, of top etch defining rings. For clarity of illustration, FIG. 2F shows one embodiment of one such ring 110 of such set, i.e., shows a top (or upper) set, and shows one such ring 120 of such set, i.e., shows a bottom (or lower) set, each for the FIG. 2C embodiment. The exemplary top etch defining ring 110 (of one top set) may be configured with an annular-shape and dimensioned to define one value of the top length L1 that overlies the top surface 82 of the wafer. The exemplary ring 110 defines the portion 68X of the central area 70 of the wafer 58, and thus extends the central area 70 radially outward from the insert 69 by extending the inactive zone 86. Another exemplary top etch defining ring 110 (of another top set) may be configured to define a different value of the top length L1.

In more detail, FIG. 2F shows the top etch defining ring 110 configured with an extension section 112 that overlies the top surface 82 of the wafer. With the insert 69 configured with a radius R69 from the axis X, the section 112 has an axial extent (or radial length) R112. The section 112 is in close proximity to the central area 70 of the wafer 58 (see bracket 70E), and thus extends the thin space 84 radially outwardly from the center area 68 to a radius RIZ of the inactive zone 80. In this sense, the center 68 is configurable by selecting a value of the radial length R112 of the radial portion defined by section 112 of the ring 110. Also, the full radial extent of the central area 70 (FIG. 2B) is thus configurable by selecting that radial length R112 and the value of R69.

To permit etching of the unique edge environs 80, the top etch defining ring 110 of the top electrode 53 is further configured with a top annular recess 114. The top annular recess 114 is configured with a wall 116 spaced in the axial direction 74 (FIG. 2A) to allow the end C1 (FIG. 2C) of the etch region 100 to overlap the upper edge environ 80. In this manner, by selecting the radius RIZ (including length R112 and radius R69), the following results: the radial location of the border B, and the radial extent of the inactive etch zone 86, may be determined. In detail, in the desired orientation, and with the top electrode 53 in the second positional relationship (FIG. 2C), the top annular recess 114 thus defines an upper cavity section 118 of the chamber cavity 77. The upper cavity section 118 overlaps (or corresponds to) the upper edge environ area 80EEA of the wafer 58. The upper cavity section 118 of the chamber cavity 77 is oriented relative to the upper edge environ 80EEA to define an upper portion of the annular etching region 100 and of the active etching zone 102 to permit etching of the upper edge environ 80EEA. The radial portion of the upper edge environ 80EEA that is etched by plasma in the upper cavity section 118 corresponds to the wafer surface 82 exposed to the plasma along the length L1 shown in FIG. 2D.

In contrast, reference is made to the embodiment of ring 110 shown in FIG. 2E. As described above, in the FIG. 2E embodiment, L1 may be defined by one set of specifications as having a value of zero (and is thus not shown). FIG. 2E thus shows that RIZ is such that the ring 110 overlaps the upper edge environ 80EEA of the wafer 58 and extends the close proximity space 84 to the edge 90 of the wafer 58. The upper edge environ 80EEA of the wafer will thus not be etched if the embodiment of the ring 110 shown in FIG. 2E is used. In detail, the ring 110 in FIG. 2E excludes the plasma in the active etch zone 102 from the inactive zone 86 as indicated by end C1 of the zone 102 not entering the inactive zone 86.

Also for accommodating such exemplary different specifications, embodiments of the present invention may also include a plurality, or set, of a bottom etch defining rings 120. To permit etching of the unique bottom edge environ 80, FIG. 2F shows an embodiment of one such ring 120 of such bottom set. The exemplary bottom etch defining ring 120 (of one bottom set) may be configured to define one value of the bottom length L2 along the bottom surface 92 of the wafer.

Another exemplary bottom etch defining ring 120 (of another bottom set) may be configured to define a different exemplary bottom length L2. For example, each of bottom length L2 of one set may have a value other than zero, but different from the value of length L2 of another set.

Referring in detail to FIG. 2F, the bottom etch defining ring 120 of the lower electrode 54 is configured with a bottom annular recess 122. The bottom annular recess 122 is configured with a wall 124 located radially from the axis X to provide the length L2. The recess 122 is further configured with a wall 126 spaced in the axial direction 74 (FIG. 2A) from the wafer 58 to allow end C2 of region 100 (FIGS. 2C & 2E) to extend across the lower edge environ 80. In the desired parallel orientation, and with the lower electrode in the second positional relationship (FIGS. 2C & 2F), the bottom annular recess 122 defines a lower cavity section 128 of the chamber cavity 77. The lower cavity section 128 is under the lower surface 92 of the lower edge environ area 80 of the wafer 58. The lower cavity section 128 of the chamber cavity 77 is oriented relative to the lower edge environ 80 to define a lower portion of the annular etching region 100 and of the active etching zone 102 to permit etching of the lower edge environ 80. The portion of the lower edge environ 80 that is etched by plasma in the lower cavity section 128 corresponds to the bottom wafer surface 92 exposed to the plasma along the length L2 shown in FIGS. 2C & 2F.

In contrast to the embodiment of the lower ring 120 shown in FIGS. 2C and 2F, FIG. 2D shows an embodiment of the lower ring 120 that may be used if there is not to be any etching of the lower surface 92 of the wafer. Here, the value of lower length L2 is zero, the bottom etch defining ring 120 has no lower cavity section 128, and L2 is thus not shown. Rather, the wall 124 of the FIG. 2D embodiment is shown spaced radially outward from the edge 90 of the wafer 58. As a result, end C2 of the line 102L is near the edge 90 and the line 102L does not extend under the wafer. In this case, the active etch zone 102 would be an exemplary upside-down L-shape, and this embodiment of the ring 120 in FIG. 2D excludes the plasma in the active etch zone 102 from the inactive zone 86 as indicated by that end C2 of the zone 102 not extending under the wafer.

Figure 3:
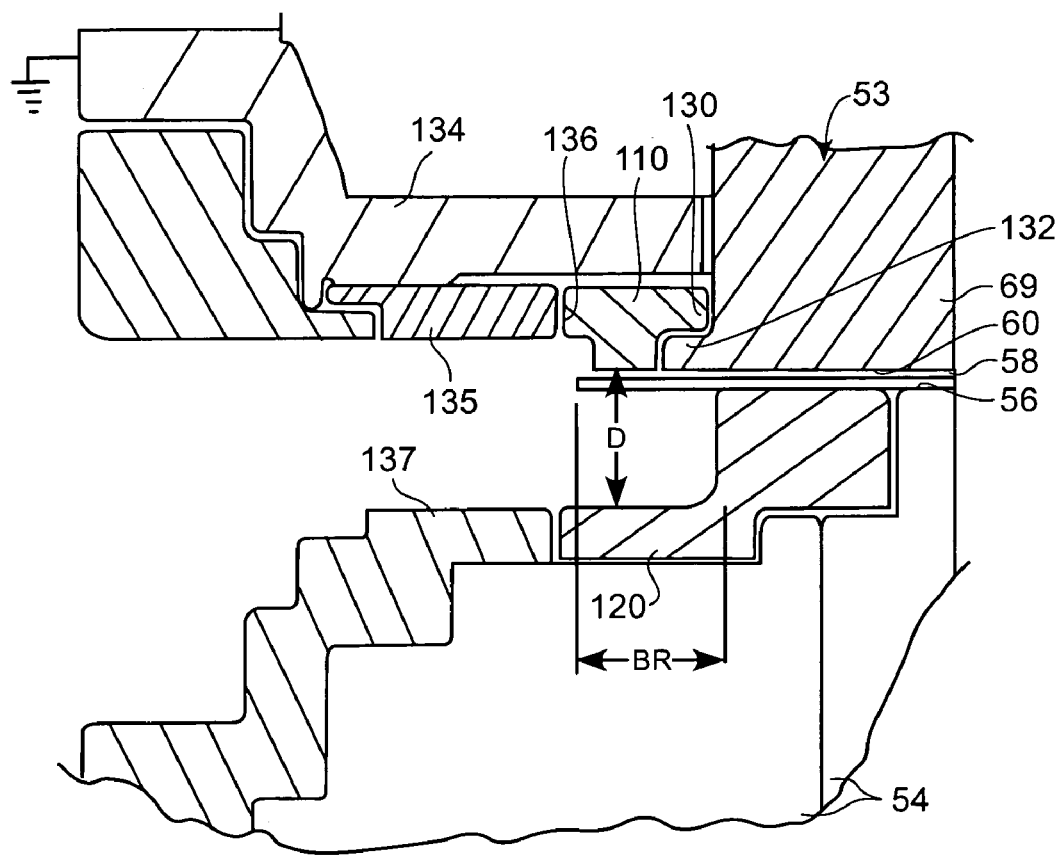
FIG. 3 is a cross sectional view similar to FIG. 2F, showing the top and bottom edge defining rings of one embodiment, in which a set of the rings is configured to be removable and replaced by top and bottom edge defining rings of a second set configured with dimensions different than those of the first set, to enable etching of a different portion of the wafers by replacing the first set with the second set.

It may be understood that with the use of selected ones of the rings 110 and 120, the bottom electrode 54 and the top electrode 53 may be configured so that the selected top etch defining ring 110 is mounted on the electrode 53 and the selected bottom ring 120 is mounted on the bottom electrode 54. In the example of the exemplary C-shaped active etch zone 102, this configuration defines an amount of etching of the top edge exclusion area 82EEA of the wafer, the amount coinciding with the length L1 and extending around the axis X. This exemplary configuration also defines an amount of etching of the bottom edge exclusion area 82EEA of the wafer, the amount coinciding with the length L2 and extending around the axis X. This exemplary configuration also defines etching of the edge 90 of the exclusion area 82EEA of the wafer, the etching extending around the axis X FIG. 3 shows the base 52 and the top electrode 53, each configured to enable replacement of each of the top etch defining ring 110 and the bottom etch defining ring 120 by another respective top and bottom etch defining ring to define the respective amount of etching (e.g., respective lengths L1 and L2) of the top and bottom of the edge environ 80 of the wafer 58. The respective amounts (lengths L1 and L2) have been shown extending parallel to the first and second reference surfaces 56 and 60. FIG. 3 also shows the second of the positional relationships, and the respective first and second reference surfaces 56 and 60 being parallel. Each of the top etch defining rings 110 of one set of top rings, and each of the bottom etch defining rings 120 of one set of bottom rings, is configured so that with the first and second reference surfaces parallel and centered and with the center area 68 of the top electrode 53 in close proximity to the central area 70 of the wafer in the second positional relationship of the reference surfaces, the following results. There is a uniform distance D between the top etch defining ring 110 and the bottom etch defining ring 120 all around each of the rings all around axis X. The uniform distance D enables uniform etching of the top and bottom of the unique edge environ 80 of the wafer 58 all around axis X. The uniformity of the distance D is consistent with the above-described thin space 84 with the central area 70 and the center area 68 close, defined above as being about 0.010 to about 0.020 inches apart.

The replacement of each of the top etch defining ring 110 and the bottom etch defining ring 120 by another respective top and bottom etch defining ring is readily facilitated by the configuration of the rings 110 and 120, in conjunction with the configurations of adjacent structures. For example, the top ring 110 is shown in FIG. 3 configured as an annulus with a generally-T cross-sectional shape to define a shoulder 130. Insert 69 is radially inside of the top ring 110 and is configured with a lower annular lip 132 that extends annularly around the axis X and radially under the shoulder 130 of the ring 110. With the insert 69 securely and removably mounted on the top electrode 53, the insert 69 holds the ring 110 on a section 134 of the top electrode 53. As shown, section 134 of the top electrode is coupled to a top edge section 135, whose surface is flush with the neighboring top etch defining ring 110. Thus, removal of one ring 110 and replacement with another ring 110 may be readily done by removal of the insert 69, and after replacement of the ring 110, by reassembling the insert 69 with the upper electrode 53. Such removal and reassembly of the insert 69 may be by a fastener, for example, that is removable from and reinsertable into the section 134. In FIG. 3 the lower ring 120 is shown resting on the lower electrode 54. As shown, the lower electrode 54 is coupled to a lower edge section 137, whose surface is flush with the neighboring bottom etch defining ring 120. Thus, removal of one ring 120 and replacement with another ring 120 may be readily done by removal of the wafer from the lower electrode 54, and after replacement of the ring 120, by placing another wafer 58 on the lower electrode 54.

The above-described replacement of each of the top etch defining ring 110 by another top etch defining ring may also be described as follows. The top etch defining ring 110 of the embodiment of FIG. 2F, for example, may be referred to as a "first" top etch defining ring 110-1 (and for clarity of illustration is not shown but is represented in FIGS. 2A-2F & 3 by reference number 110). The first top etch defining ring 110-1 may be configured to extend the thin space 84 radially outwardly from the center area 68 by the distance R112 having the first value. The length L1 is adjusted corresponding to that extension distance R112. The top etch defining ring 110 may also comprise and be referred to as a "second" top etch defining ring 110-2 (and for clarity of illustration is not shown, but is represented in FIGS. 2A-2F & 3 by reference number 110). The second top etch defining ring 110-2 of the embodiment of FIG. 2F, for example, may be configured to extend the thin space 84 radially outwardly from the center area 68 by the distance R112 having a second value (referred to as "R2"). The length L1 is adjusted corresponding to that extension distance R2. In another embodiment of the ring 110, when L1 is zero, the value of R112 extends from the insert 69 to the edge 90. Each of the first top etch defining ring 110-1 and second top etch defining ring 110-2 may be configured to be insertable into and removable from the top electrode 53 as described above. The second distance R2 (and thus the length L1) may be different from the first distance R1 (and thus the length L1) so that the extent (e.g., radial extent) of etching of the unique upper edge environ 80 may be selected according to which of the exemplary first or second top etch defining rings 110-1 or 110-2 is assembled with the top electrode 53. Additional rings 110 may be configured with different distances R112 according to the range of values of R112 that are desired.

The above-described replacement of each of the bottom etch defining ring 120 by another bottom etch defining ring 120 may also be described as follows in relation to FIG. 3. Referring to the embodiment of FIG. 2C of the ring 120, for example, the bottom etch defining ring 120 shown in FIG. 3 may be referred to as a "first" bottom etch defining ring 120-1 (and for clarity of illustration is not shown, but is represented in FIGS. 2A, 2C, 2D, 2F & 3 by reference number 120). The first bottom etch defining ring 120-1 may be configured with a radial length BR to define the length L2 having a first value, referred to as L2-1 corresponding to a length referred to as BR-1. The bottom etch defining ring 120 may also comprise and be referred to as a "second" bottom etch defining ring 120-2 (and for clarity of illustration is not shown, but is represented in FIGS. 2A, 2C, 2D, 2F & 3 by reference number 120). The second bottom etch defining ring 120-2 may be configured with the radial length BR to define the length L2 having a second value, referred to as L2-2 corresponding to a length referred to as BR-2. The second length BR-2 may have a value different from the value of the first length BR-1, so that the second length L2-2 may be different from the first length L2-1. Each of the first bottom etch defining ring 120-1 and second bottom etch defining ring 120-2 may be configured to be insertable onto and removable from the lower electrode 54 as described above. In this manner, the extent (e.g., radial extent) of etching of the unique lower edge environ 80 may be selected according to which of the first or second bottom etch defining rings 120-1 or 120-2 is inserted onto the lower electrode 54.

It may be understood that the rings 110 and 120 may be configured from a material that is resistant to the effects of the plasma. For example, such materials may be taken from the following group: aluminum oxide, yttrium-coated aluminum, silicon carbide, barium nitride, barium carbide, carbon, diamond, graphite, quartz, and yttrium oxide.

Referring to the drive 62 in more detail, FIG. 2B shows the annular etching region 100 extending in an annular path around the wafer 58, as do the etch defining rings 110 and 120. As indicated by the portion of zone 86 shown in FIG. 2C, the inactive etch zone 86 also extends radially across the wafer 58 from the axis X and extends axially between the central area 70 and the second reference surface 60 defined by the center area 68. To assure uniform etching of the edge environ 80 around the axis X, the positional relationships between the surfaces 56 and 60 are to be and remain parallel and centered. This means that the movement of the top electrode 53 (via the linkage 66 and the wedge assembly 64 of the drive 62) maintains the parallelism and centering of the surfaces 56 and 60 when those surfaces are in each of the first and second positional relationships and during the movement between those relationships. This parallelism and centering provides that for the described uniform removal of the undesired materials 78: (1) the central area 70 of the upper surface 82 of the wafer 58 is uniformly in close proximity to the center area 68 of the top electrode 53, and (2) the edge environ 80 is centered relative to the axis X in the annular etching region 100 for uniform etching of the undesired materials 78 to take place.

Figure 4:
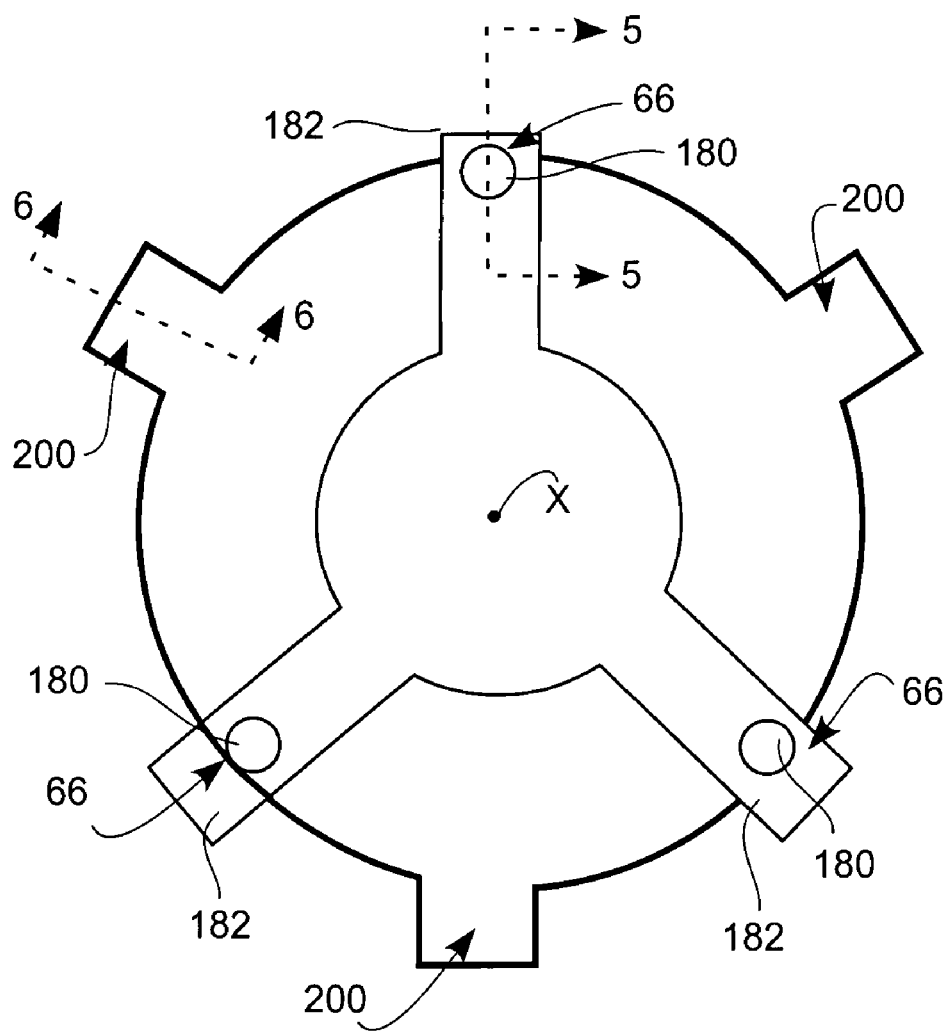
FIG. 4 is a plan view taken on line 4-4 in FIG. 1, showing the spacing around a wafer axis of sections of a drive effective through sections of an adjustable linkage for moving the reference surfaces into the positional relationships.
Figure 5:
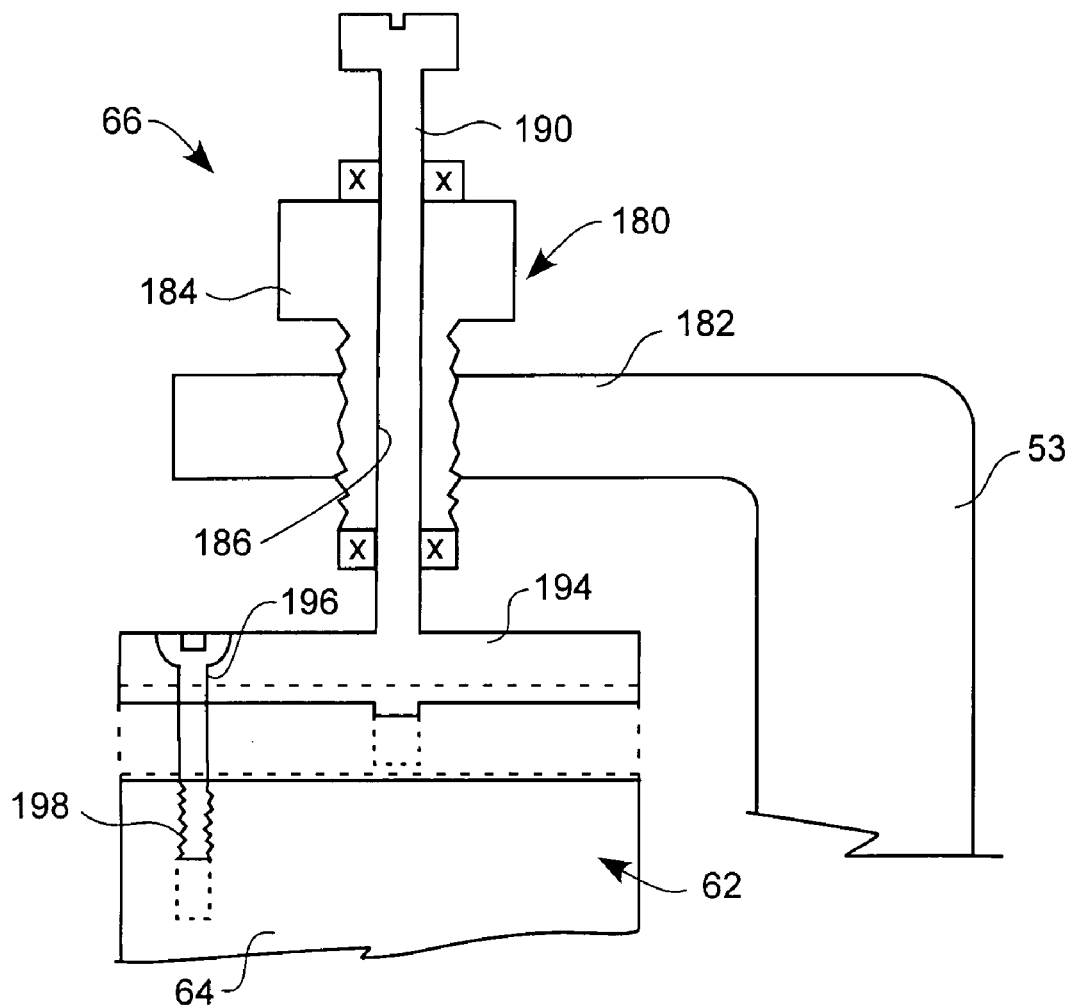
FIG. 5 is an enlarged cross sectional view taken on line 5-5 in FIG. 4 showing in solid lines one section of the linkage in a loosened condition to facilitate adjustment to orient the first reference surface with respect to the second reference surface, and illustrating in dashed lines the linkage in a tightened condition to hold the first reference surface oriented with respect to the second reference surface.

Before use of the process chamber 50, the linkage 66 is adjusted to establish the parallel positional relationship of the surfaces 56 and 60. Referring to the plan view of FIG. 4, the linkage 66 is shown configured in three sections 180 spaced around the axis X at 120 degree intervals. Each linkage section 180 cooperates with a first arm 182 that is secured to the top electrode 53. The arm 182 is shown in FIGS. 4 and 5 extending horizontally from the top electrode 53 into the linkage section 180. With the linkage section 180 loosened as described below, the arm 182 is oriented within the loosened linkage section 180 according to how the top electrode 53 is positioned when the first and second reference surfaces 56 and 60 are parallel. Thus, each arm 182 may be oriented differently within the respective linkage section 180. With this arm orientation in mind, reference is made to FIG. 5 that shows a vertical section of a typical linkage section 180 with the oriented arm 182. FIG. 5 shows a loosened condition of the section 180 in solid lines, and in dashed lines shows the section 180 in a tightened condition to secure the linkage 66 to the top electrode 53 and to the wedge assembly 64 ready for an etching operation.

Referring to FIG. 5, the oriented arm 182 is shown extending horizontally, and secured to an adjuster block 184. The block 184 is configured with a bore 186 to receive an adjuster screw 190 for rotation. The rotation moves the screw 190 up or down relative to the block 184 and the arm 182. The screw 190 is secured to a lock member 194. The screw movement up and down also moves the lock member 194 up and down. To condition the linkage section 180 for adjustment, the screw 190 is initially rotated so that the lock member 194 is in an up position (shown in solid lines). By rotating the screw 190, the lock member 194 may be moved downwardly from the up position until the lock member 194 moves away from the arm 182 and touches the linear drive assembly 64. Care is taken to not rotate the screw 190 more than required for the lock member 194 to just touch the assembly 64, so that the orientation of the top electrode 53 is not changed. To lock the lock member 194 to the linear drive assembly, the member 194 is configured with a hole 196 aligned with a threaded hole, for example, in the linear drive assembly 64, so that a bolt 198 may secure the lock member 194 to the assembly 64.

As described, each linkage section 180 may be the same. Thus, the same structure as is described for the one linkage section 180 is provided at the other two spaced locations. Rotation of the screw 190 may occur in each section 180 so that the orientation of the top electrode 53 is not changed by any of the linkage sections 180. Also, the same bolting of the lock members 194 occurs so that each of the linkage sections 180 is secured to the respective linear drive assembly 64. In this manner, there is no change in the established parallel and centered positional relationship of the surfaces 56 and 60, and the many sections 180 cooperate to secure the top electrode 53 to the respective linear drive assemblies 64 while maintaining that established parallel and centered positional relationship of the surfaces 56 and 60.

Figure 6:
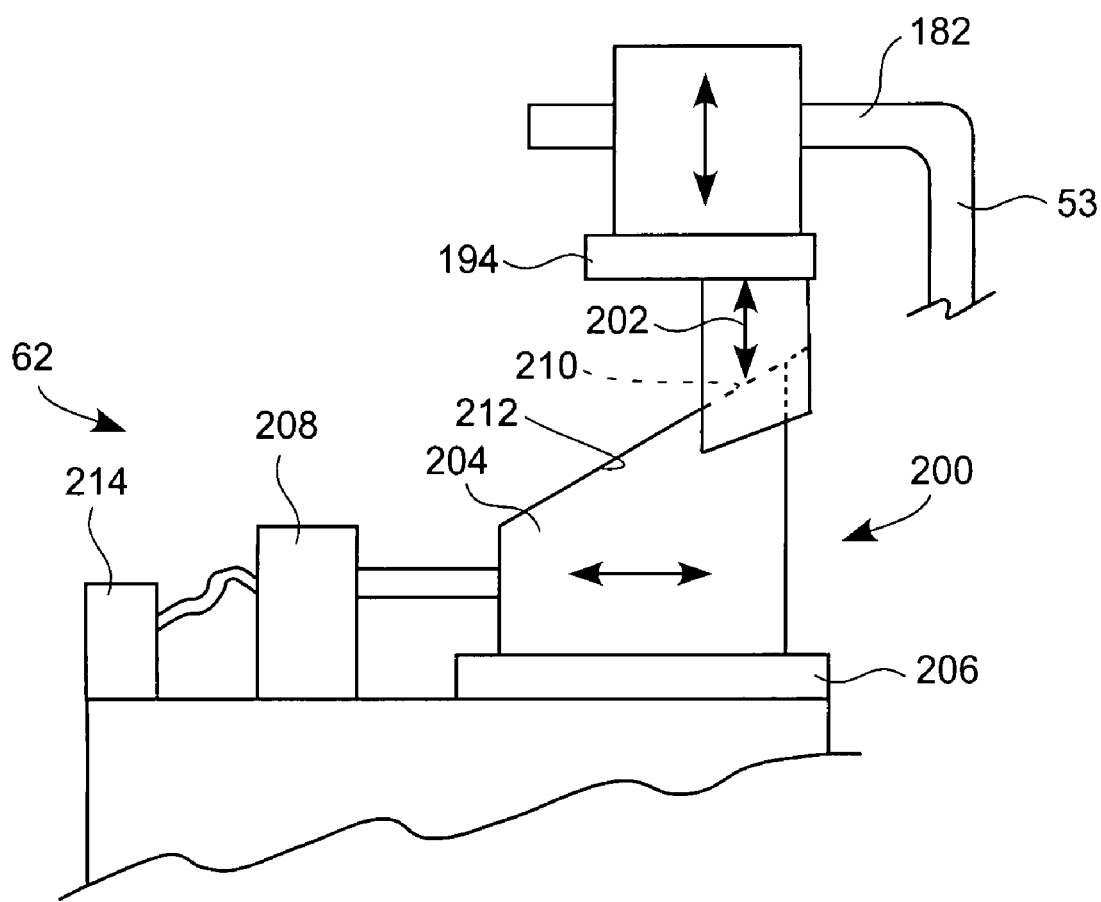
FIG. 6 is a cross sectional view taken on line 6-6 in FIG. 4, showing the configuration of one of the sections of the drive.

With the linkage sections 180 secured to the linear drive assemblies 64, the drive 62 may be operated. Referring to FIG. 6, one wedge assembly embodiment of the linear drive assembly 64 is shown including a representative one wedge section 200 of three wedge sections of the assembly 64. The sections 200 are located around the axis X as shown in FIG. 4. Each wedge section 200 may be the same. Thus, the same structure as is described for the one wedge section 200 is provided at the other two spaced locations. The one exemplary section 200 is configured with a first wedge member 202 secured by the bolt 198 to the lock member 194. The lock member 194 holds the wedge member 202 against horizontal movement, but the first wedge member 202 is free to move up and down with the lock member 194 to correspondingly, move the arm 182 and the top electrode 53. This up and down movement is under the action of a second wedge member 204 that is connected to a slide 206 secured to the base 52. A motor 208 may be actuated to move the second wedge member 204 on the slide 206 so that a first inclined surface 210 of the first wedge member 202 is urged up, for example, by a second inclined surface 212 of the second wedge member 204. Oppositely, reverse actuation of the motor 208 causes the surface 212 to allow the first wedge member 202 to move down.

As described, the same structure as is described for the wedge sections 200 is at the three spaced locations. Also, the motor 208 of each wedge section 200 may be actuated, for example, by hydraulic fluid from a common manifold 214 so that the same fluid pressure is applied to each motor and the same upward or downward motion is applied at the same time to each of the first wedge members 202 shown in FIG. 6. In this manner, the top electrode 53 is moved up and down so that there is no change in the established parallel and centered positional relationship of the surfaces 56 and 60, and the top electrode 53 moves while maintaining that established parallel and centered positional relationship of the surfaces 56 and 60.

It may be understood from FIGS. 1 and 6 that by the motor 208 moving the second wedge member 204 to the left, the first wedge member 202 is moved up and moves the top electrode 53 and the second reference surface 60 upward away from the first reference surface 56 into the first positional relationship (FIG. 2A). Oppositely, by the motor 208 moving the second wedge member 204 to the right in FIGS. 1 and 6, the first wedge member 202 is allowed to move down to allow the top electrode and the second reference surface 60 to move down toward the first reference surface 56 into the second positional relationship.

In this manner, by the angular shapes of the first wedge member 202 and second wedge member 204, the wedge assembly 64 is configured to apply a driving force through the linkage 66 to the top electrode 53. This force acts through each linkage section 180 equally to maintain the desired orientation. That orientation is with the surfaces 56 and 60 parallel (resulting in the upper wafer surface 82 also parallel to the reference surface 60), and the surfaces 56 and 60 centered (to center the annular etching zone 102 relative to the axis X). That orientation is maintained by the moving first wedge member 202 driving the linkage 66 to move the top electrode 53. In review, one such movement may be the top electrode 53 moving the second reference surface 60 into the second positional relationship (FIG. 2C), wherein the second positional relationship is the second reference surface 60 in close proximity with the first reference surface 56, and thus the upper surface 82 of the wafer 58 also in close proximity to the second reference surface 60, to define the inactive etch zone 86 in the process chamber 50. As described above, the space 84 (defining the spacing of the central area 70 and the center area 68) results from the close proximity of the second reference surface 60 with the first reference surface 56. The described movement of the top electrode 53 moving the second reference surface 60 into the second positional relationship (FIG. 2C) may configure the inactive etching zone 86 with the described dimension in the direction of movement (i.e., the direction of the X axis) of about 0.010 inches to about 0.020 inches. With the described multiple linkage sections 180 and wedge sections 200, such dimension in the direction of movement may be provided within the dimensional tolerance of about plus or minus 0.002 inches. This dimension of the space 84 in the direction of movement is repeatable during the relative movement of the upper electrode 53 and the lower electrode 54, e.g., due to the positional relationships between the surfaces 56 and 60 remaining parallel and centered to assure the uniform etching of the edge environ 80 around the axis X.

It may be understood that other embodiments of the linear drive assembly 64 other than the wedge assembly may be provided. For example, a vertically-oriented pneumatic motor may be used in lieu of the wedge assemblies, and drive the upper electrode 53 through the linkage 66.

In review, embodiments of the present invention fill the above-described needs by providing semiconductor manufacturing apparatus configured for defining the separate regions of process exclusion and process performance in a process chamber for manufacturing the semiconductor wafers. The separate region of process exclusion may be configured as the inactive etch zone 86 resulting from the configuration of the linkage sections 180, by which the top electrode 53 is connected to the drive 62 without a change in the established parallel or centered positional relationship of the surfaces 56 and 60. Also, the many linkage sections 180 cooperate to secure the top electrode 53 to the linear drive assembly 64 while maintaining that established positional relationship of the surfaces 56 and 60. This separate region of process exclusion configured as the inactive etch zone 86 is also facilitated by the exemplary motor 208 moving the exemplary second wedge member 204 to move the top electrode 53 and the second reference surface 60 to allow the top electrode and the second reference surface 60 to move down toward the first reference surface 56 into the second positional relationship by which the inactive etch zone 86 is defined.

According to the above-described specifications, the separate region of process performance may be configured as the region in which the process such as etching is allowed to be performed on the wafer only on the unique edge environ 80. Such etching has been described as being permitted in the region 100, i.e., in the active etch zone 102. In the one embodiment, to conform to one exemplary specification, the exemplary generally C-shape cross section is a region of plasma light up. The exemplary region 100 extends from C1 along the length L1 of the upper surface 82, around the peripheral edge 90 and to the bottom surface 92 of the wafer. The exemplary region 100 extends along a bottom length L2 of the bottom surface 92 to C2. Thus, the active etch zone 102 defined by the region 100 may be configured by embodiments of the invention to extend within the line 102L from the end C1 radially outwardly, adjacent to and around the annular edge environ 80 to end C2, to enable the removal of the undesired materials 78 according to the applicable specification. The border B between the end C1 of the annular etching region 100 and the inactive etch zone 86 indicates that these regions of process exclusion and process performance are separate in the process chamber 50. Thus, these embodiments are configured so that the etching is excluded from the central area 70 of the wafers, and the etching is allowed to be performed on the wafer 58 only on the unique edge environ 80.

In review, an embodiment of the etching chamber 50 may include the lower electrode 54 for supporting the wafer 58. The top electrode 53 may have the center area 68 that is not powered, the center area 68 being configured to be positioned in close proximity to the central area 70 of the wafer 58 when the wafer is supported by the lower electrode. The annular region 100 may be defined between the top electrode 53 and the lower electrode 54 to define the active etching zone 102 that is configurable to enable etching of the unique edge environ 80 of the wafer. The top etch defining ring 110 is configured to define at least a portion of the active etching zone 102 corresponding to a portion of the unique edge environ 80 extending along the top length L1 of the top 82 of the wafer. The top length L1 is in the active etching zone 102. The bottom etch defining ring 120 may be configured to define a portion of the active etching zone 102 corresponding to a portion of the unique edge environ 80 extending along the bottom length L2 of the bottom 92 of the wafer 58. The bottom length L2 is in the active etching zone 102. The portion of the unique edge environ 80 is defined according to the applicable specification as described above with respect to FIGS. 2F and 3.

The embodiments of the present invention also fill the above-described needs by being readily configured for uniform removal of the undesired materials 78 from the entire unique edge environ 80 (i.e., around the annular edge area of the upper wafer surface 82 that surrounds the central area 70, and around the edge 90 of the wafer, and under the edge area along the bottom surface 92 near the edge 90 of the wafer 58) as may be specified by the applicable specification. Such uniform removal is without removing materials from or otherwise damaging the central area 70. The operation of the linkage sections 180 so that there is no change in the established parallel and centered positional relationship of the surfaces 56 and 60, and the operation of the many sections 180 that cooperate to secure the top electrode 53 to the base 52 while maintaining that established parallel positional relationship of the surfaces 56 and 60, contribute to filling these needs. For example, this is by establishing and maintaining the close proximity of the surfaces 56 and 60 uniformly all around the axis X, so that there is the axially-thin space 84 that defines the chamber cavity 77 as being configured with the inactive etching zone 86 uniformly around the axis X between the central area 70 of the wafer and the center area 68 of the top electrode 53.

The embodiments of the present invention also fill the above-described needs by being configured for removing the undesired materials 78 from different radial lengths of each of the unique edge environs 80 according to specifications for different type of wafers. For example, reference was made above to lengths extending in a radial direction relative to the axis X, including the top length L1 defining the portion of the upper wafer surface 82 from which the undesired materials 78 are to be uniformly removed, and including the bottom length L2 defining the portion of the lower wafer surface 92 from which the undesired materials 78 are to be uniformly removed. The rings 110 and 120, and sets of such rings, thus may provide the second value of distance R112 (and thus a unique value of the length L1) different from the first value of distance R112 (and thus a different value of the length L1) so that the extent (e.g., radial extent) of etching of the upper edge environ 80 may be selected according to which of the first or second top etch defining rings 110-1 or 110-2 is assembled with the top electrode 53. Also, with respect to the bottom ring 120 described in reference to FIG. 3, the exemplary second length BR-2 may have a unique value different from the value of the first length BR-1, so that the exemplary second length L2-2 may be different from the exemplary first length L2-2. In this manner, the radial extent of etching of the lower edge environ 80 may be selected according to which of the first or second bottom etch defining rings 120-1 or 120-2 is inserted into the chuck 54.

Also, the provision of the rings 110 and 120 is in an easily-replaceable configuration. This renders the transition from one ring, e.g., ring 110 (or 120) to another ring 110 (or 120) to be readily accomplished in a cost-effective manner. For example, significantly lower cost results from the expedient of replacing only one or both of the rings 110 and 120. Thus, the rings 110 and 120 render it unnecessary to replace any other part of the respective top or bottom electrodes 53 and 54, e.g., it is not required to replace entire electrodes themselves, or any significant part of such electrodes 53 and or 54. Rather, only one or both of the top etch defining ring 110 and the bottom etch defining ring 120 need be replaced by another respective top and bottom etch defining ring 110 or 120 to define the respective unique value of the amount of etching of the top and bottom edge exclusion area 80 of the wafer 58. The respective values of these amounts extend parallel to the respective first and second reference surfaces 56 and 60. Thus, the replacement of the rings 110 and 120 may be done without replacing any part of the electrode 53 or of the bottom electrode 54 other than the rings 110 and/or 120. The significantly lower cost resulting from such replacement also relates to the above-described ease by which each of the respective rings 110 and 120 may be removed, and another differently-configured ring substituted. As described above, for replacement of the ring 110 the insert 69 may be removed, and then after substitution of the new ring 110 the same insert 69 may be reassembled with the upper electrode 53.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An etching chamber, comprising:
   a lower electrode being primarily conductive and defined for supporting a wafer directly on the top surface of the lower conductive electrode, wherein the lower electrode has a lower edge section;
   a top electrode configured to have a center area that is not powered, the center area being configured to be positioned in close proximity to a central area of the wafer when the wafer is supported by the lower electrode, wherein the top electrode has a top edge section, and wherein the close proximity of the center area of the top electrode and the central area of the wafer defines an inactive etching zone to inhibit etching of the central area of the wafer;
   an annular region defined between the top electrode and the lower electrode, wherein the annular region defines an active etching zone being configurable to enable etching of a unique edge environ of the wafer;
   a top etch defining ring configured to define a portion of the active etching zone corresponding to a portion of the unique edge environ extending along a top length of an upper surface of the wafer from a wafer edge, the top length being in the active etching zone, wherein the top etch defining ring separates the top edge section of the top electrode from a center portion of the top electrode, and wherein the top etch defining ring being configured to be removable and replaceable to change the top length, and wherein the top etch defining ring is a single piece; and
   a bottom etch defining ring configured to define another portion of the active etching zone corresponding to another portion of the unique edge environ extending along a bottom length along a bottom surface of the wafer from the wafer edge, the bottom length being in the active etching zone, wherein the bottom etch defining ring separates the lower edge section of the lower electrode from a center portion of the lower electrode, and wherein the bottom etch defining ring being configured to be removable and replaceable to change the bottom length, and wherein the bottom etch defining ring is a single piece.

2. The etching chamber of claim 1, wherein each of the top etch defining ring and the bottom etch defining ring is replaceable by a respective top and bottom etch defining rings to establish the respective top and bottom length of etching of the unique edge environ of the wafer.

3. The etching chamber of claim 1, wherein:
the top etch defining ring is configured with an inner section that is an extension of the center area of the electrode that is in close proximity with the central area of the wafer to define a border between the inactive etching zone and the active etching zone, wherein a surface of the inner section of the top etch defining ring is flush with a surface of the center area of the top electrode facing the wafer.

4. The etching chamber of claim 3, wherein:
the top etch defining ring is further configured with an outer section extending away from the center area of the electrode, wherein the outer section defines the top length of the upper surface of the wafer from the wafer edge to be in the active etching zone, and wherein a surface of the outer section of the top etching defining ring is further away from the upper surface of the wafer than the surface of the inner section.

5. The etching chamber of claim 4, wherein:
the bottom etch defining ring is further configured with an inner bottom section in close proximity with the bottom surface of the wafer, the inner bottom section defining a border of the active etching zone, wherein a surface of the inner bottom section of the bottom etch defining ring is flush with a surface of the lower electrode facing the wafer; and
the bottom etch defining ring is further configured with an outer bottom section extending away from the center portion of the lower electrode, wherein the outer bottom section defines the bottom length of the bottom surface of the wafer from the wafer edge to be in the active etching zone, and wherein a surface of the outer bottom section of the bottom etch defining ring is further away form the bottom surface of the wafer than the surface of the inner bottom section.

6. The etching chamber of claim 5, wherein a distance between the outer bottom section of the bottom etch defining ring and the outer section of the top etch defining ring is between about 0.01 inch to about 0.02 inch.

7. The etching chamber of claim 1, wherein the top electrode is configured to provide power for processing the supported wafer.

8. The etching chamber of claim 1, wherein the center area of the top electrode is configured with a mounted insert, and wherein the insert is made of a dielectric material.

9. The etching chamber of clam 8, wherein the mounted insert has a lower annular lip that extends under a shoulder of the top etch defining ring, wherein the mounted insert holds the top etch defining ring with a section of the top electrode.

10. The etching chamber of claim 1, wherein the unique edge environ of the wafer includes the upper surface of the wafer defined by the top length, an edge area around the peripheral edge of the wafer, and the bottom surface of the wafer defined by the bottom length.

11. The etching chamber of claim 1, wherein the top etch defining ring and the bottom etch defining ring are made of a material resistant to the effects of plasma.

12. The etching chamber of claim 11, wherein the material is selected from the group consisting of aluminum oxide, yttrium-coated aluminum, silicon carbide, barium nitride, barium carbide, carbon, diamond, graphite, quartz, or yttrium oxide.

13. An electrode assembly for etching a unique edge environ of a wafer, comprising:
a lower electrode being primarily conductive and defined for supporting a wafer directly on the top surface of the lower conductive electrode, wherein the lower electrode has a lower edge section;
a top electrode configured to have a center area that is not powered, the center area being configured to be positioned in close proximity to a central area of the wafer when the wafer is supported by the lower electrode, wherein the top electrode has a top edge section, and wherein the close proximity of the center area of the top electrode and the central area of the wafer defines an inactive etching zone to inhibit etching of the central area of the wafer, an annular region defined between the top electrode and the lower electrode, wherein the annular region defines an active etching zone being configurable to enable etching of a unique edge environ of the wafer;
a top etch defining ring configured to define a portion of the active etching zone corresponding to a portion of the unique edge environ extending along a top length of an upper surface of the wafer from a wafer edge, the top length being in the active etching zone, wherein the top etch defining ring separates the top edge section of the top electrode from a center portion of the top electrode, and wherein the top etch defining ring being configured to be removable and replaceable; and
a bottom etch defining ring configured to define another portion of the active etching zone corresponding to another portion of the unique edge environ extending along a bottom length along a bottom surface of the wafer from the wafer edge, the bottom length being in the active etching zone, wherein the bottom etch defining ring separates the lower edge section of the lower electrode from a center portion of the lower electrode.

14. The etching chamber of claim 13, wherein each of the top etch defining ring and the bottom etch defining ring is replaceable by a respective top and bottom etch defining rings to establish the respective top and bottom length of etching of the unique edge environ of the wafer.

15. The etching chamber of claim 13, wherein:
the top etch defining ring is configured with an inner section that is an extension of the center area of the electrode that is in close proximity with the central area of the wafer to define a border between the inactive etching zone and the active etching zone, wherein a surface of the inner section of the top etch defining ring is flush with a surface of the center area of the top electrode facing the wafer, and
top etch defining ring is further configured with an outer section extending away from the center area of the electrode, wherein the outer section defines the top length of the upper surface of the wafer from the wafer edge to be in the active etching zone, and wherein a surface of the outer section of the top etching defining ring is further away from the upper surface of the wafer than the surface of the inner section.

16. The etching chamber of claim 13, wherein:
the bottom etch defining ring is further configured with an inner bottom section in close proximity with the bottom surface of the wafer, the inner bottom section defining a border of the active etching zone, wherein a surface of the inner bottom section of the bottom etch defining ring is flush with a surface of the lower electrode facing the wafer, and
the bottom etch defining ring is further configured with an outer bottom section extending away from the center portion of the lower electrode, wherein the outer bottom section defines the bottom length of the bottom surface of the wafer from the wafer edge to be in the active etching zone, and wherein a surface of the outer bottom section of the bottom etch defining ring is further away form the bottom surface of the wafer than the surface of the inner bottom section.

17. The etching chamber of claim 13, wherein the top electrode is configured to provide power for processing the supported wafer.

18. The etching chamber of claim 13, wherein the center area of the top electrode is configured with a mounted insert, and wherein the insert is made of a dielectric material.

19. The etching chamber of clam 18, wherein the mounted insert has a lower annular lip that extends under a shoulder of the top etch defining ring, wherein the mounted insert holds the top etch defining ring with a section of the top electrode.

20. The etching chamber of claim 13, wherein the top etch defining ring and the bottom etch defining ring are made of a material resistant to the effects of plasma.

* * * * *